(12) United States Patent
Singh et al.

(10) Patent No.: US 11,127,818 B2
(45) Date of Patent: Sep. 21, 2021

(54) HIGH VOLTAGE TRANSISTOR WITH FIN SOURCE/DRAIN REGIONS AND TRENCH GATE STRUCTURE

(71) Applicant: GLOBALFOUNDRIES U.S. Inc., Santa Clara, CA (US)

(72) Inventors: Jagar Singh, Clifton Park, NY (US); Srikanth Balaji Samavedam, Cohoes, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 67 days.

(21) Appl. No.: 16/526,529

(22) Filed: Jul. 30, 2019

(65) Prior Publication Data

US 2021/0036108 A1 Feb. 4, 2021

(51) Int. Cl.
*H01L 29/08* (2006.01)
*H01L 21/8234* (2006.01)
*H01L 29/423* (2006.01)
*H01L 27/088* (2006.01)

(52) U.S. Cl.
CPC .. *H01L 29/0847* (2013.01); *H01L 21/823431* (2013.01); *H01L 27/0886* (2013.01); *H01L 29/4236* (2013.01)

(58) Field of Classification Search
CPC .................................................. H01L 29/4236
See application file for complete search history.

(56) References Cited

U.S. PATENT DOCUMENTS

| | | |
|---|---|---|
| 6,277,707 B1 | 8/2001 | Lee et al. |
| 8,476,684 B2 | 7/2013 | Coyne et al. |
| 9,276,088 B1 * | 3/2016 | Singh ................. H01L 27/0886 |
| 9,520,396 B2 | 12/2016 | Singh |
| 2009/0085113 A1 * | 4/2009 | Izumi ................. H01L 29/7835 257/343 |
| 2014/0167162 A1 * | 6/2014 | He .................... H01L 29/66795 257/347 |

* cited by examiner

*Primary Examiner* — Jay C Chang
*Assistant Examiner* — Mikka Liu
(74) *Attorney, Agent, or Firm* — Hoffman Warnick LLC

(57) ABSTRACT

An illustrative device includes a transistor including a first set of fins defined above a substrate, a second set of fins defined above the substrate, and a gate structure embedded in the substrate between the first set of fins and the second set of fins, wherein the first set of fins and the second set of fins are doped with a first dopant type and the substrate is doped with a second dopant type different than the first dopant type.

20 Claims, 6 Drawing Sheets

HIGH VOLTAGE TRANSISTOR WITH FIN SOURCE/DRAIN REGIONS AND TRENCH GATE STRUCTURE

BACKGROUND

Field of the Invention

The present disclosure generally relates to the fabrication of semiconductor devices, and, more particularly, to a high voltage transistor with fin source/drain regions and trench gate structure.

Description of the Related Art

Integrated circuits formed on semiconductor wafers typically include a large number of circuit elements, which form an electric circuit. In addition to active devices such as, for example, field effect transistors and/or bipolar transistors, integrated circuits may include passive devices, such as resistors, inductors and/or capacitors. In particular, during the fabrication of complex integrated circuits using CMOS technology, millions of transistors, i.e., N-channel transistors and P-channel transistors, are formed on a substrate including a crystalline semiconductor layer.

A MOS transistor, for example, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin gate insulating layer. The conductivity of the channel region, upon formation of a conductive channel due to the application of an appropriate control voltage to the gate electrode, depends on, among other things, the dopant concentration, the mobility of the majority charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors.

For rectifying and/or switching applications, high-voltage transistors are needed. Particularly, there is an increasing demand in semiconductor manufacturing to integrate high-voltage devices with high-performance (e.g., low voltage, high speed) devices and high-yield conventional bulk transistor devices for system on chip applications. Such integrated devices are useful in, for example, analog and mixed signal applications.

However, in practice, integrating high-voltage and high-performance devices (Fully Depleted) SOI FETs (Semiconductor-on-Insulator Field Effect Transistors) has proven problematic due in part to the differences in dimensional scaling of the respective devices. Involved patterning procedures are needed that significantly increase the overall manufacturing complexity. In addition, due to present constraints caused by the gate insulation layer (e.g., oxide materials) processes in use today, there are significant processing challenges to having gate insulation layers (e.g., oxide materials) on the same die that support both high-performance low-voltage transistor devices and high-voltage transistor devices that operate at voltages that may exceed 5 or 10 V. This is due in part to the fact that a gate insulation layer on a particular die is typically optimized for either a high-performance device or a high-voltage device, but not for both at the same tune. Moreover, in the art, relatively thicker gate insulation layers of high-voltage transistor devices have to be formed in the course of gate patterning of other low-voltage FETs, which significantly complicates the overall patterning process.

The present disclosure is directed to various methods and resulting devices that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a high voltage transistor with fin source/drain regions and trench gate structure and the resulting devices. An illustrative device includes, among other things, a transistor including a first set of fins defined above a substrate, a second set of fins defined above the substrate, and a gate structure embedded in the substrate between the first set of fins and the second set of fins, wherein the first set of fins and the second set of fins are doped with a first dopant type and the substrate is doped with a second dopant type different than the first dopant type.

An illustrative method includes, among other things, forming a first set of fins doped with a first dopant type above a substrate, forming a second set of fins doped with the first dopant type above the substrate, forming a first trench in the substrate between the first set of fins and the second set of fins, and forming a gate structure in the first trench, wherein the substrate is doped with a second dopant type different than the first dopant type.

Another illustrative method includes, among other things, forming a plurality of fins above a substrate, removing a portion of the plurality fins and a portion of the substrate to define a first trench in the substrate and divide the plurality of fins into a first set of fins and a second set of fins, doping the first and second sets of fins with a first dopant type, wherein the substrate is doped with a second dopant type different than the first dopant type, forming a second trench in the substrate, forming a dielectric layer in the first trench and the second trench, forming a gate electrode in the trench above the dielectric layer, and forming a substrate contact doped with the second type of dopant in the substrate adjacent the second trench.

BRIEF DESCRIPTION OF THE DRAWINGS

The disclosure may be understood by reference to the following description taken in conjunction with the accompanying drawings, in which like reference numerals identify like elements, and in which.

Figure 1:
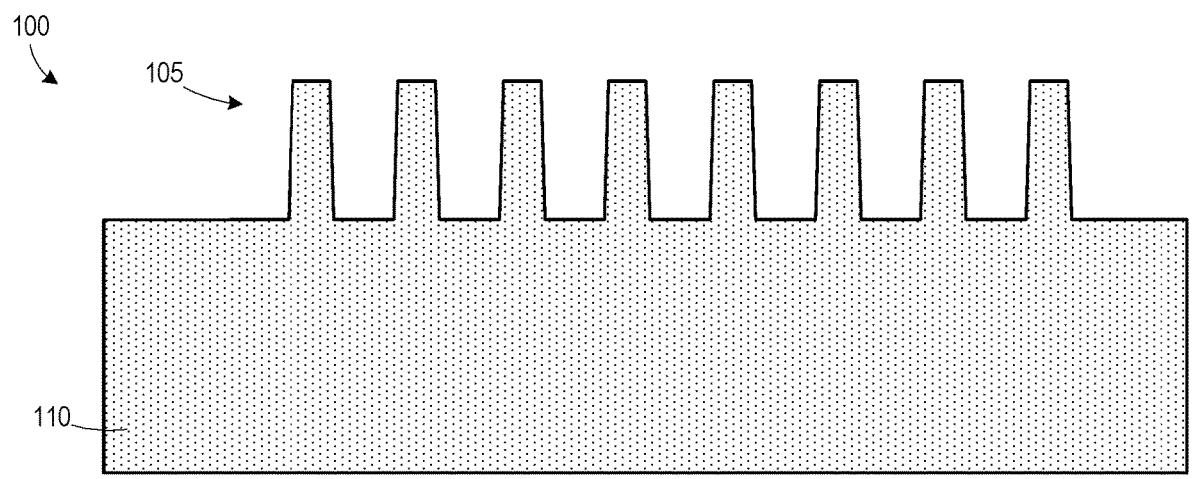
FIGS. 1-12 depict a method of forming a high voltage transistor with fin source/drain regions and trench gate structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a high voltage transistor with fin source/drain regions and trench gate structure and the resulting devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 1-10 illustrate various novel methods disclosed herein for forming a high voltage transistor device 100. FIG. 1 shows a cross-sectional view of a plurality of fins 105 defined in a substrate 110. The number of fins 105 and the spacing between the fins 105 may vary depending on the particular characteristics of the device(s) being formed. The substrate 110 may have a variety of configurations, such as the depicted bulk silicon configuration. The substrate 110 may also have a silicon-on-insulator (SOI) configuration that includes a bulk silicon layer, a buried insulation layer and an active layer, wherein semiconductor devices are formed in and above the active layer. The substrate 110 may be formed of silicon or silicon germanium or it may be made of materials other than silicon, such as germanium. Thus, the terms "substrate" or "semiconductor substrate" should be understood to cover all semiconducting materials and all forms of such materials. The substrate 110 may have different layers. For example, the fins 105 may be formed in a process layer formed above the base layer of the substrate 110.

In general, the process flow for forming the resistor device 100 may be integrated with a process flow for forming low voltage finFET transistor devices (not shown). Similar fins (not shown) may be employed, wherein source/drain and channel regions for the finFET devices may be formed.

Figure 2:
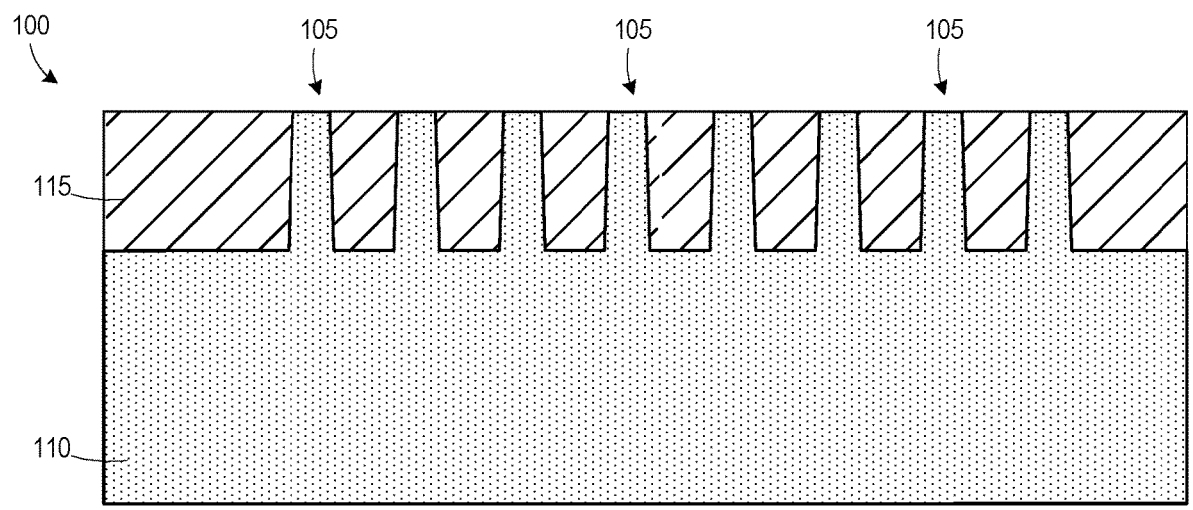

FIG. 2 illustrates the high voltage transistor device 100 after a dielectric layer 115 was formed over the fins 105 and planarized to expose top surfaces of the fins 105. In some embodiments, the dielectric layer is silicon dioxide, a low-k dielectric material, or another suitable material.

Figure 3:
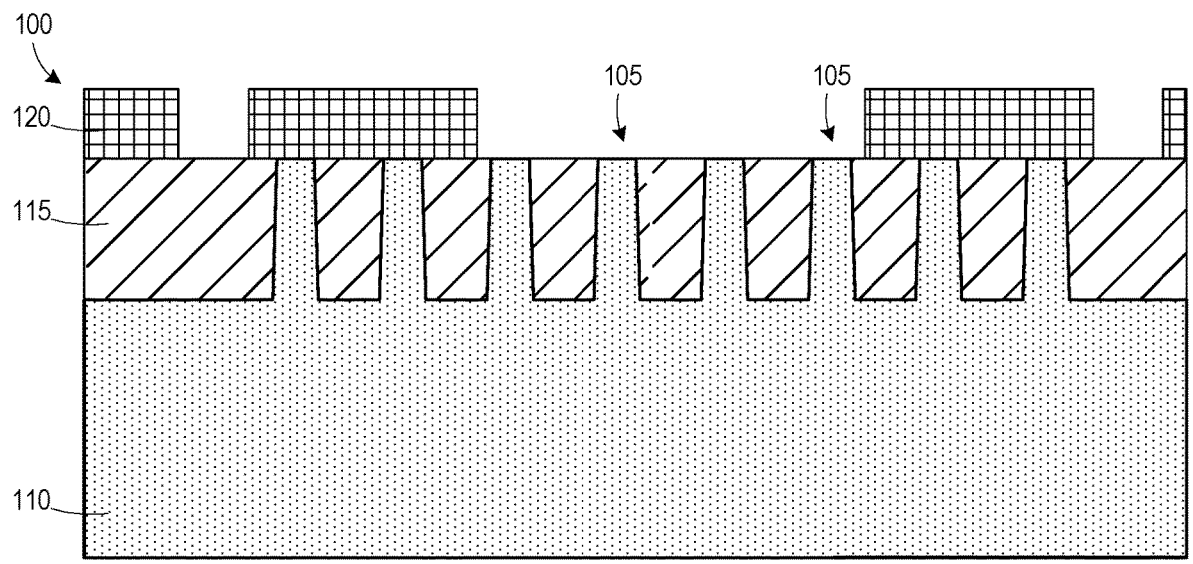

FIG. 3 illustrates the high voltage transistor device 100 after a patterned hard mask 120 is formed over the dielectric layer 115. In some embodiments, the patterned hard mask 120 includes multiple layers. For example, a silicon nitride layer may be formed over a silicon dioxide layer. In some embodiments, a photolithography stack is employed to pattern the hard mask layer 120. For example, a bottom anti-reflective coating (BARC) layer may be formed over the hard mask layer, an organic planarization layer (OPL) may be formed over the BARC layer, and a photoresist layer may be formed over the OPL layer. The photoresist layer is exposed to a light source to define a pattern, and one or more etch processes are performed to transfer the pattern to the hard mask layer 120.

Figure 4:
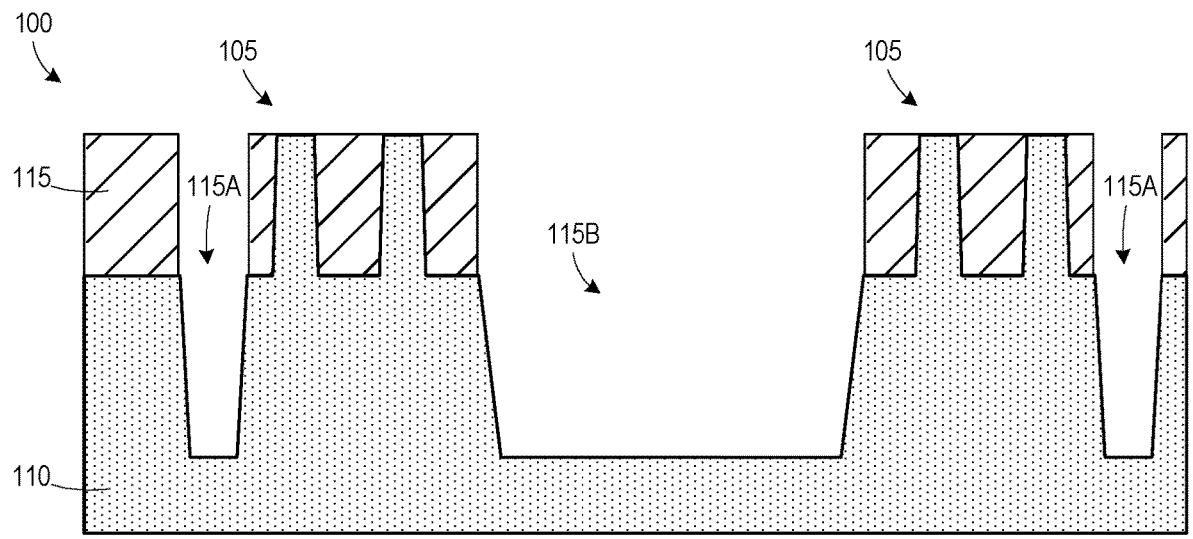

FIG. 4 illustrates the high voltage transistor device 100 after an etch process (e.g., an anisotropic etch process) was performed in the presence of the patterned hard mask layer 120 to remove the exposed fins and define trenches 115A, 115B in the substrate 110 and the hard mask layer 120 was removed. In some embodiments, the trenches 115A define single diffusion break regions and the trench 115B defines a double diffusion break region.

Figure 5:
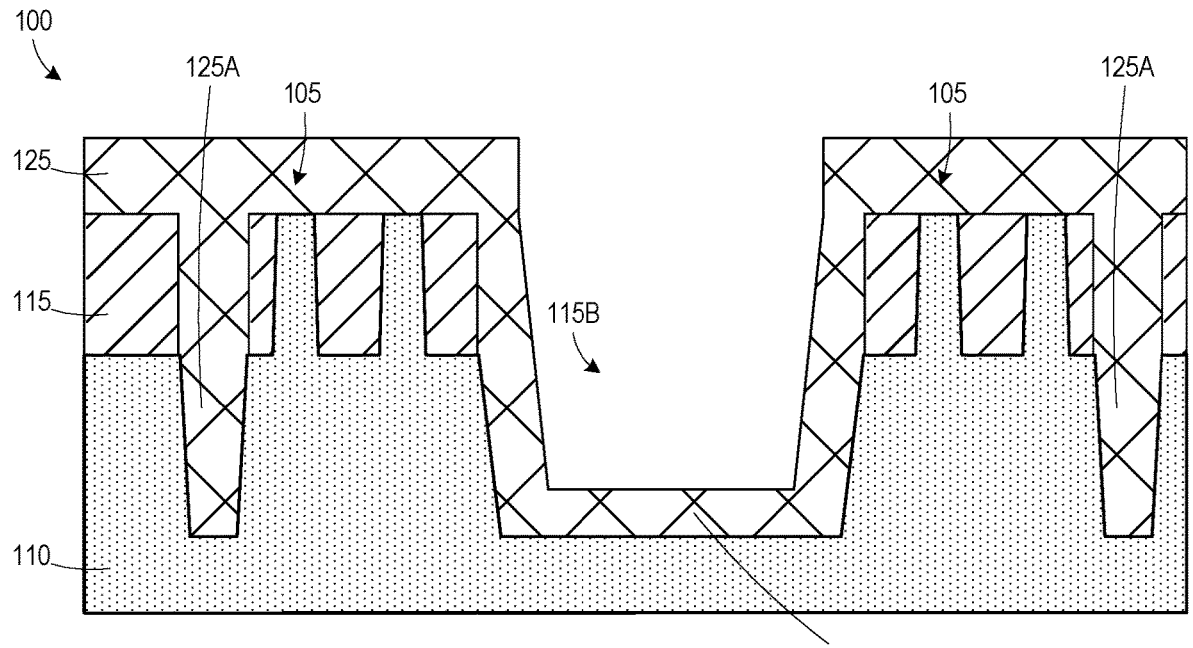

FIG. 5 illustrates the high voltage transistor device 100 after a deposition process was performed to form a dielectric layer 125 in the trenches 115A, 115B. In some embodiments, first portions 125A of the dielectric layer 125 pinch off in the trenches 115A, substantially filling the trenches 115A, and a second portion 125B of the dielectric layer 125 forms a conformal layer in the trench 115B. In some embodiments, air gaps (not illustrated) are defined in the first portions 125A due to incomplete pinch-off. The first portions 125A define diffusion breaks.

Figure 6:
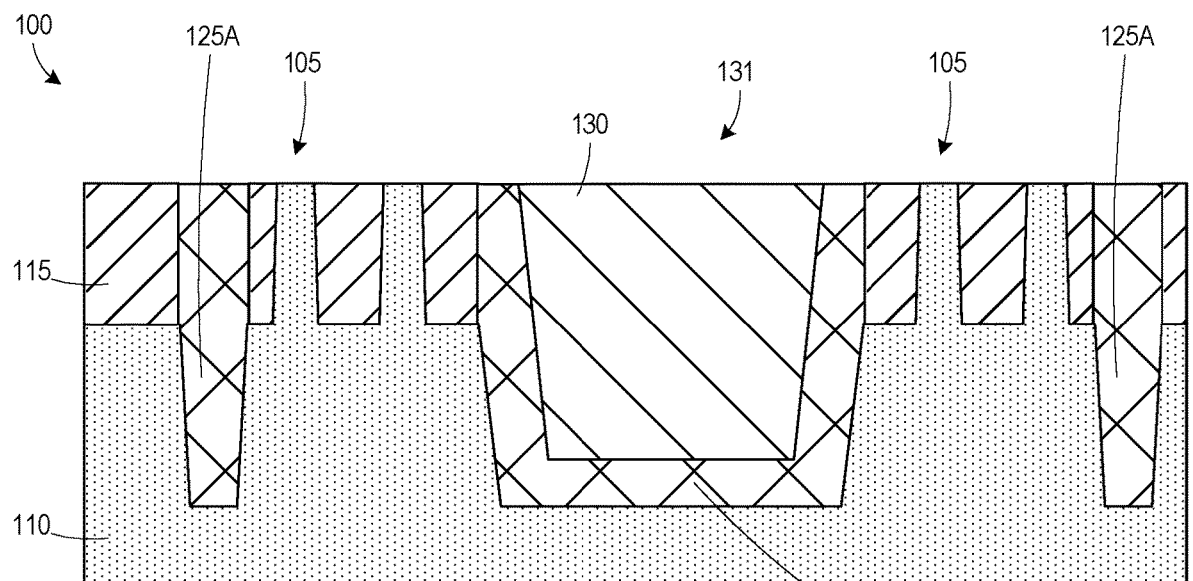

FIG. 6 illustrates the high voltage transistor device 100 after a deposition process was performed to form a gate electrode 130 in the trench 115B and a planarization process was performed. In some embodiments, the planarization process removes portions of the dielectric layer 125 positioned above the dielectric layer 115. In some embodiments, the gate electrode 130 is polysilicon. In some embodiments, the polysilicon is doped in-situ, while, in other embodiments, a masked implantation process is performed to dope the polysilicon. In some embodiments, the polysilicon is later replaced with a metal, such as during a replacement metal gate (RMG) process used for other finFET devices in the product. The gate electrode 130 and the portion 125B of the dielectric layer 125 lining the trench 115B define a gate structure 131.

Figure 7:
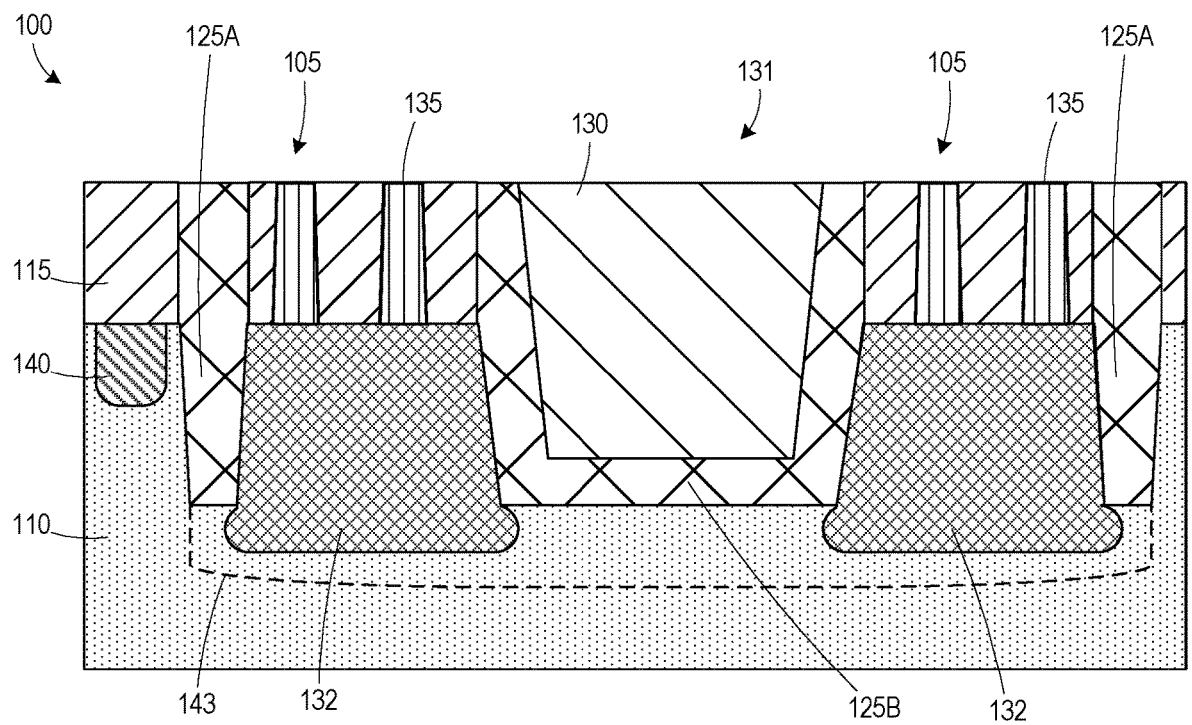

FIG. 7 illustrates the high voltage transistor device 100 after one or more implantation processes were performed to form wells 132 in the substrate 110, source/drain regions 135 in the fins 105, and a substrate contact 140 in the substrate 110. In one example, the substrate 110 may have been doped with a P-type dopant, and the high voltage transistor device 100 is an N-type device. The implantation process introduces N-type dopants (N−) into the substrate 110 to define the wells 132 and into the fins 105 (N+) to define the source/drain regions 135. A separate masked implant process may be performed to introduce P-type dopants (P+) into the substrate 110 to define the substrate contact 140. In some embodiments, substrate contacts 140 are formed on both sides of the diffusion breaks 125A.

In another example, the substrate 110 may have been doped with a P-type dopant, and the high voltage transistor device 100 is a P-type device. The implantation process introduces P-type dopants (P−) into the substrate 110 to define the wells 132 and into the fins 105 (P+) to define the source/drain regions 135. A separate masked implant process may be performed to introduce N-type dopants (N+) into the substrate 110 to define the substrate contact 140 and to define an N-type triple well 143 (shown in phantom lines in FIG. 7, but not illustrated elsewhere).

Figure 8:
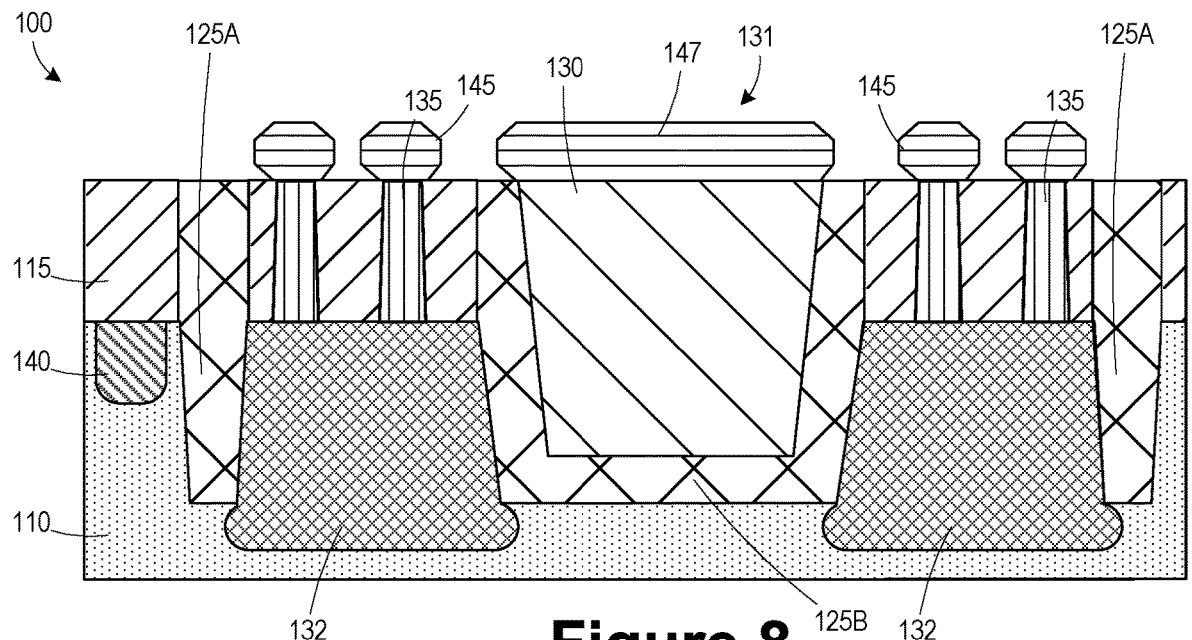

FIG. 8 illustrates the high voltage transistor device 100 after an epitaxial growth process has been performed to form epitaxial regions 145 (e.g., N-doped) on end portions of the fins 105 in the source/drain regions 135. In some embodiments, the epitaxial regions 145 may be grown until they merge above the fins. The epitaxial regions 145 provide a contact site to which a subsequent contact may be formed. In some embodiments, an epitaxial region 147 is also grown on the gate electrode 130.

Figure 9:
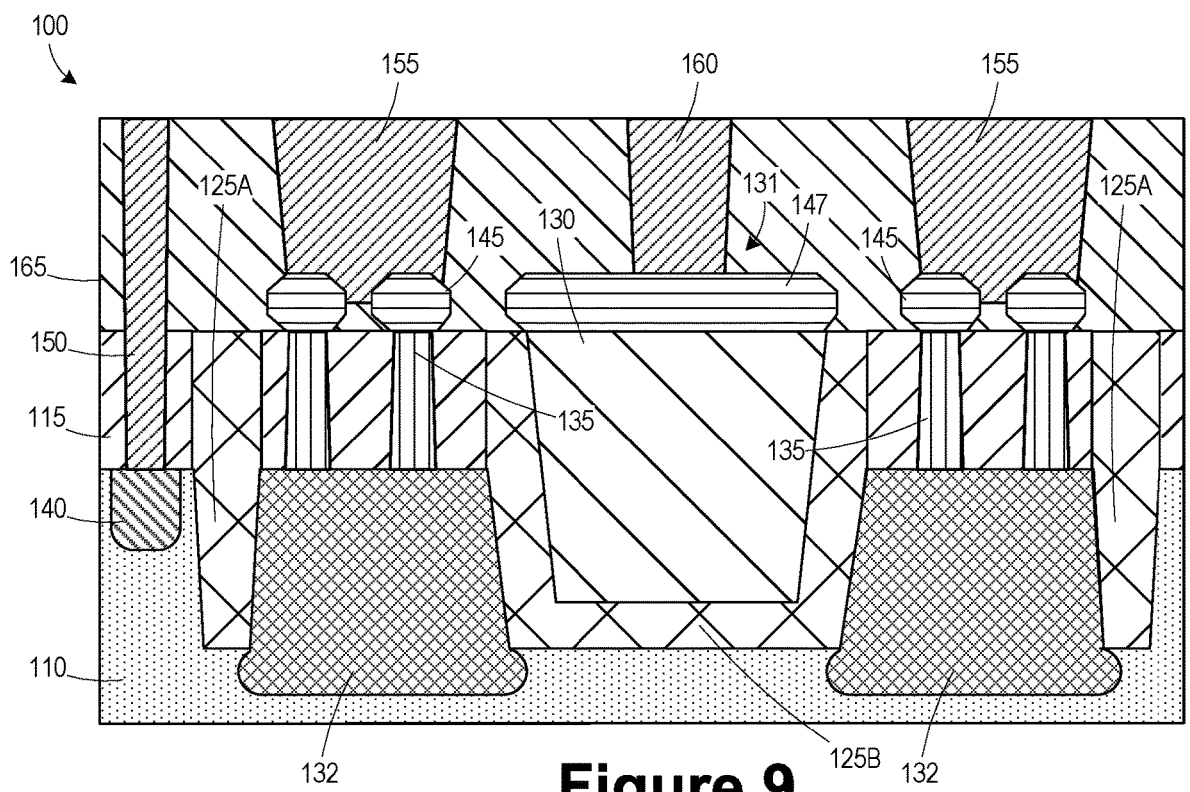

FIG. 9 illustrates the high voltage transistor device 100 after several processes were performed to form a substrate contact 150, source/drain contacts 155, and a gate contact 160 embedded in a dielectric layer 165. The substrate contact 150 extends through the dielectric layer 115 to contact the substrate contact 140. The source/drain contacts 155 contact the epitaxial regions 145, and a gate contact 160 contacts the gate electrode 130. The dielectric layer 165 was formed over the dielectric layer 115 and the epitaxial regions 145. A masked etch process was performed to define contact openings, and one or more deposition processes were performed to form conductive material in the contact openings to form the contacts 150, 155, 160. In some embodiments, the contacts 150, 155, 160 are silicide material. In some embodiments, the contacts 150, 155, 160 are metal. In some embodiments, the contacts 150, 155, 160 include multiple layers, such as a barrier layer, a seed layer, and a conductive fill layer. In some embodiments, the conductive fill layer may be cobalt, copper, tungsten, aluminum, another metal, or a silicide of one of the listed metals or another metal.

Figure 10:
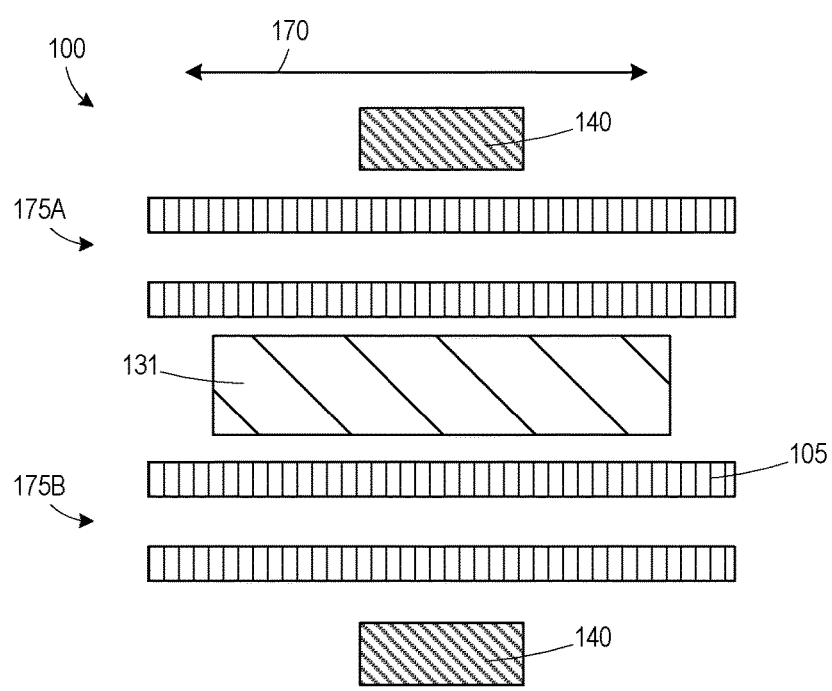

FIG. 10 is a simplified top view of the high voltage transistor device 100 illustrating the orientation of the fins 105 relative to the gate electrode 130. In the embodiment of FIG. 10, fins 105 and the gate structure 131 extend in an axial length direction 170 parallel to one another. The trench 115B for forming the gate electrode 130 was formed by removing selected fins 105 to provide a first set 175A and a second set 175B of parallel fins 105.

Figure 11:
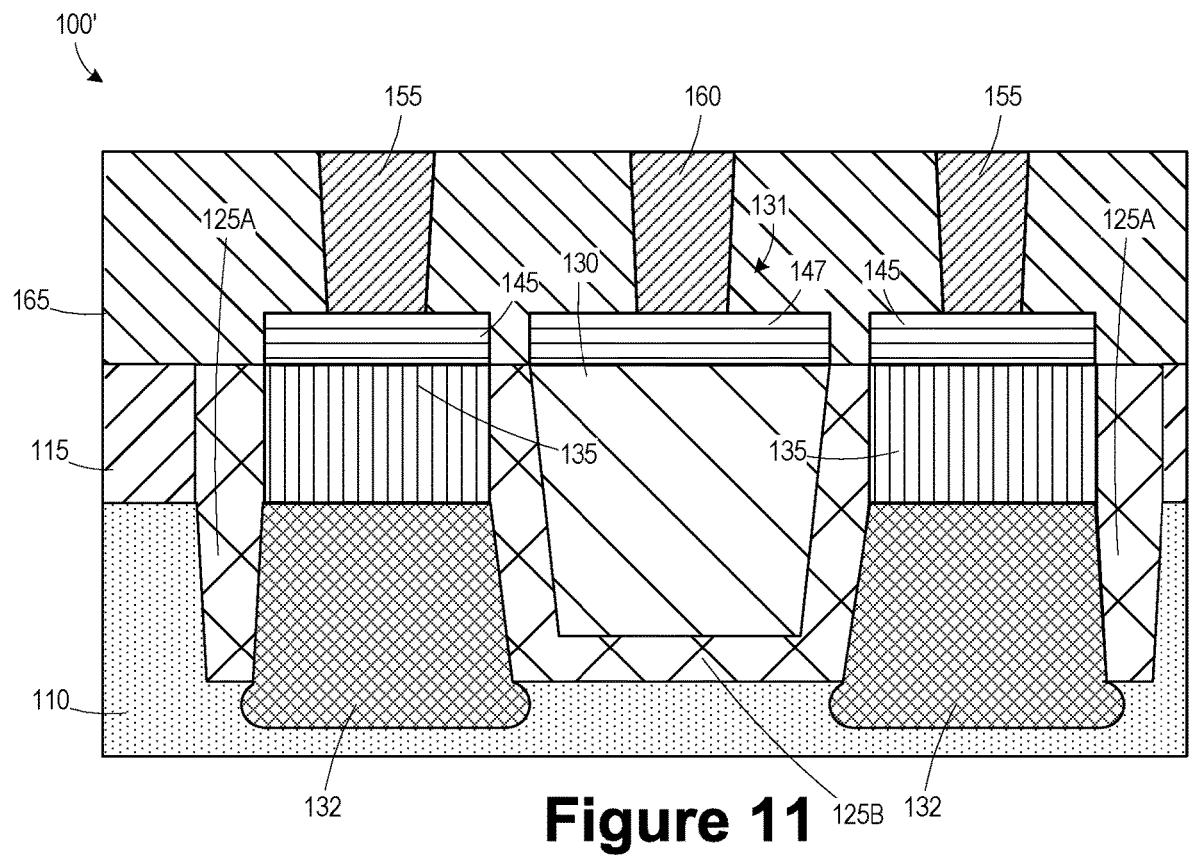
Figure 12:
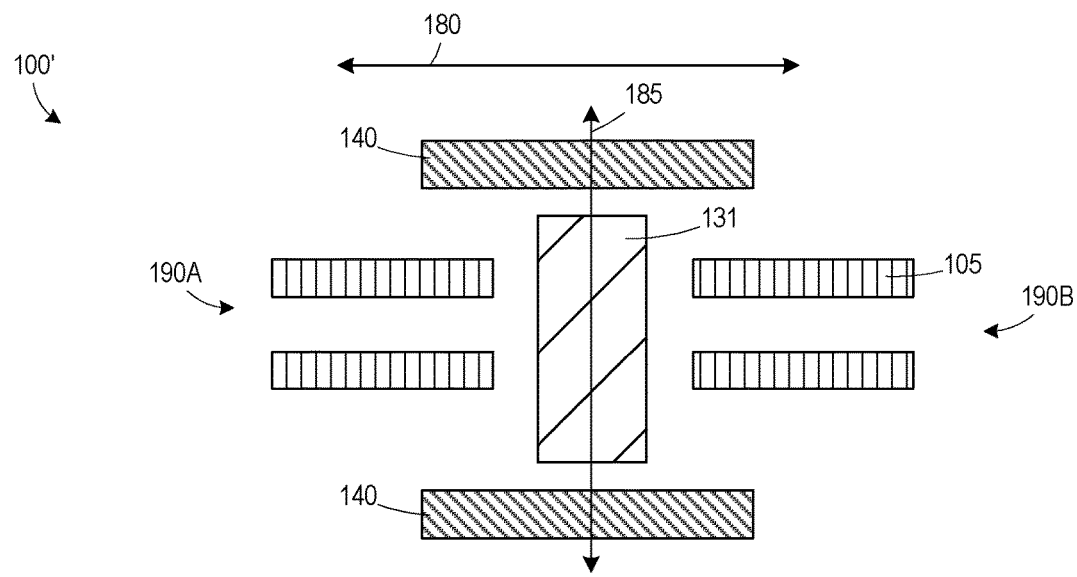

FIGS. 11 and 12 illustrate cross section and simplified top views of an alternative embodiment of a high voltage transistor device 100', respectively, where the gate structure 131 extends in an axial direction 180 perpendicular to an axial direction 185 in which the fins 105 extend. The trench 115B for forming the gate electrode 130 was formed by cutting the fins 105 along the axial length of the fins 105 to provide a first set 190A and a second set 190B of axially aligned fins 105. Processes illustrated in FIGS. 1-10 may be used to form the high voltage transistor device 100' illustrated in FIGS. 11 and 12. In the embodiment of FIGS. 11 and 12, substrate contacts 140 are formed on sides of the gate electrode 130.

The processes for forming the high voltage transistor device 100, 100' may be integrated with that of other finFET devices (e.g., low voltage devices). For example, the etch process of FIG. 4 may be combined with the etch process for forming diffusion breaks in the finFET devices. The formation of the gate electrode 130 may also be integrated into the gate processing of the finFET devices. The channel length of the high voltage transistor device 100, 100' may be controlled based on the width of the trench 115B. The operating voltage of the high voltage transistor device 100, 100' may depend on the thickness of the portion 125B of the dielectric layer 125 lining the trench 115B. For example, a thickness of about 200 Angstroms supports an operating voltage of about 10V, and a thickness of about 1000 Angstroms supports an operating voltage of about 50V.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor, comprising:
a first set of fins defined above a substrate;
a second set of fins defined above the substrate;
a gate structure embedded in the substrate between the first set of fins and the second set of fins, wherein the first set of fins and the second set of fins are doped with a first dopant type, and the substrate is doped with a second dopant type different than the first dopant type;
a first well positioned in the substrate under the first set of fins; and
a second well positioned in the substrate under the second set of fins, wherein the first well and the second well are doped with the first dopant type.

2. The transistor of claim 1, further comprising:
a substrate contact defined in the substrate; and
an isolation structure positioned in the substrate between the substrate contact and a first well.

3. The transistor of claim 1, further comprising a third well positioned in the substrate below the gate structure, wherein the third well is doped with the second dopant type.

4. The transistor of claim 1, further comprising a substrate contact defined in the substrate adjacent one of the gate structure and the first set of fins.

5. The transistor of claim 1, wherein the gate structure comprises:
   a dielectric layer lining a trench defined in the substrate; and
   a gate electrode positioned above the dielectric layer in the trench.

6. The transistor of claim 1, further comprising:
   a first epitaxial region positioned on the first set of fins; and
   a second epitaxial region positioned on the second set of fins.

7. The transistor of claim 1, wherein the first set of fins and the second set of fins extend in a first axial direction, and the gate structure extends in a second axial direction parallel to the first axial direction.

8. The transistor of claim 1, wherein the first set of fins and the second set of fins are axially aligned and extend in a first axial direction, and the gate structure extends in a second axial direction perpendicular to the first axial direction.

9. A transistor, comprising:
   a first set of fins defined above a substrate;
   a second set of fins defined above the substrate;
   a gate structure embedded in the substrate between the first set of fins and the second set of fins, wherein the first set of fins and the second set of fins are doped with a first dopant type, and the substrate is doped with a second dopant type different than the first dopant type;
   a substrate contact defined in the substrate; and
   an isolation structure positioned in the substrate between the substrate contact and a first well.

10. The transistor of claim 9, further comprising a second well positioned in the substrate below the gate structure, wherein the second well is doped with the second dopant type.

11. The transistor of claim 9, further comprising a substrate contact defined in the substrate adjacent one of the gate structure and the first set of fins.

12. The transistor of claim 9, wherein the gate structure comprises:
   a dielectric layer lining a trench defined in the substrate; and
   a gate electrode positioned above the dielectric layer in the trench.

13. The transistor of claim 9, further comprising:
   a first epitaxial region positioned on the first set of fins; and
   a second epitaxial region positioned on the second set of fins.

14. The transistor of claim 9, wherein the first set of fins and the second set of fins extend in a first axial direction, and the gate structure extends in a second axial direction parallel to the first axial direction.

15. The transistor of claim 9, wherein the first set of fins and the second set of fins are axially aligned and extend in a first axial direction, and the gate structure extends in a second axial direction perpendicular to the first axial direction.

16. A transistor, comprising:
   a first set of fins defined above a substrate;
   a second set of fins defined above the substrate;
   a gate structure embedded in the substrate between the first set of fins and the second set of fins, wherein the first set of fins and the second set of fins are doped with a first dopant type, and the substrate is doped with a second dopant type different than the first dopant type;
   a first epitaxial region positioned on the first set of fins; and
   a second epitaxial region positioned on the second set of fins.

17. The transistor of claim 16, further comprising a well positioned in the substrate below the gate structure, wherein the well is doped with the second dopant type.

18. The transistor of claim 16, further comprising a substrate contact defined in the substrate adjacent one of the gate structure and the first set of fins.

19. The transistor of claim 16, wherein the gate structure comprises:
   a dielectric layer lining a trench defined in the substrate; and
   a gate electrode positioned above the dielectric layer in the trench.

20. The transistor of claim 16, wherein the first set of fins and the second set of fins extend in a first axial direction, and the gate structure extends in a second axial direction parallel to the first axial direction.

* * * * *